United States Patent [19]

Canepa et al.

[11] Patent Number: 5,055,897
[45] Date of Patent: Oct. 8, 1991

[54] SEMICONDUCTOR CELL FOR NEURAL NETWORK AND THE LIKE

[75] Inventors: George R. Canepa, Folsom; Mark A. Holler, Palo Alto; Simon M. Tam, San Mateo, all of Calif.

[73] Assignee: Intel Corporation, Santa Clara, Calif.

[21] Appl. No.: 225,035

[22] Filed: Jul. 27, 1988

[51] Int. Cl.[5] ............... H01L 29/68; H01L 27/02; H01L 27/10; H03K 19/08

[52] U.S. Cl. ............... 357/23.5; 357/40; 357/41; 357/42; 357/45; 307/201; 365/185

[58] Field of Search ............... 357/23.5, 40, 45, 41, 357/42, 59; 307/201; 365/185

[56] References Cited

U.S. PATENT DOCUMENTS

| | | | |
|---|---|---|---|
| 3,906,296 | 8/1971 | Maserjian et al. | 357/7 |
| 4,595,999 | 6/1986 | Betirac | 357/23.5 |
| 4,660,166 | 4/1987 | Hopfield | 364/807 |
| 4,760,437 | 7/1988 | Denker et al. | 357/30 |
| 4,773,024 | 9/1988 | Faggin et al. | 364/513 |
| 4,782,460 | 11/1988 | Spencer | 364/807 |
| 4,802,103 | 1/1989 | Faggin et al. | 364/513 |

FOREIGN PATENT DOCUMENTS

| | | |
|---|---|---|
| 0040251 | 11/1980 | European Pat. Off. . |
| 0121464 | 3/1984 | European Pat. Off. . |
| 0138439 | 9/1984 | European Pat. Off. . |
| 2049278 | 4/1980 | United Kingdom . |

Primary Examiner—Mark Prenty
Attorney, Agent, or Firm—Blakely, Sokoloff, Taylor & Zafman

[57] ABSTRACT

A cell employing floating gate storage device particularly suited for neural networks. The floating gate from the floating gate device extends to and becomes part of a second, field effect device. Current through the second device is affected by the charge on the floating gate. The weighting factor for the cell is determined by the amount of charge on the floating gate. By charging the floating gate to various levels, a continuum of weighting factors is obtained. Multiplication is obtained since the current through the second device is a function of the weighting factor.

16 Claims, 4 Drawing Sheets

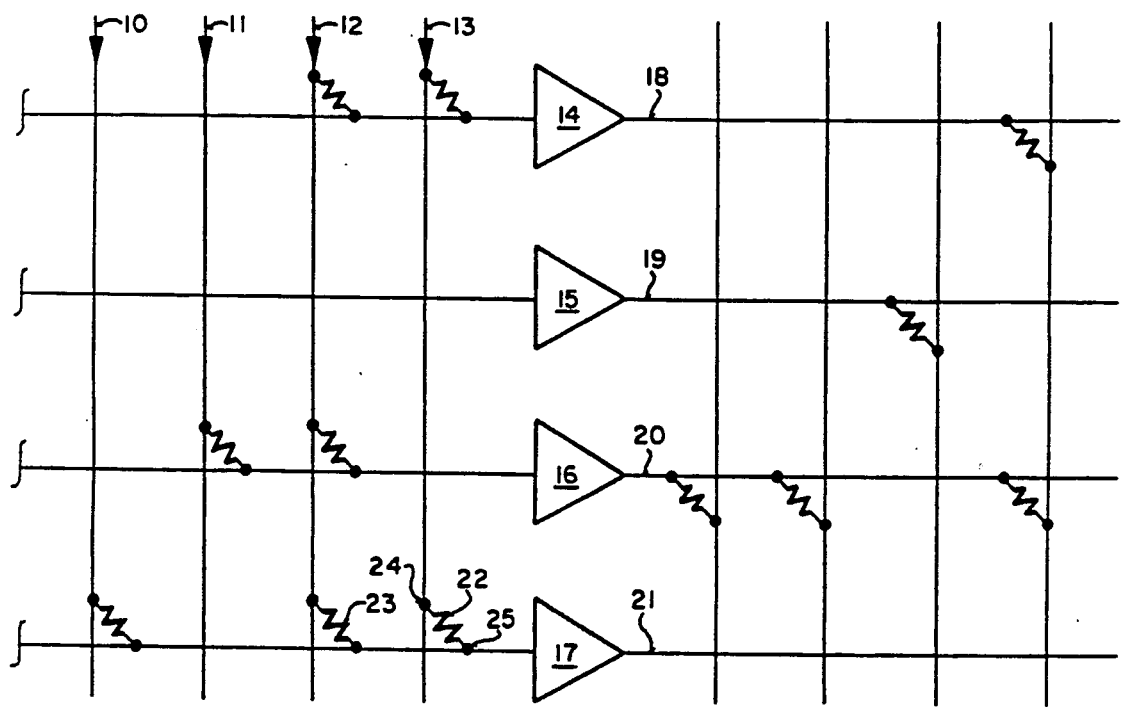
FIG_1
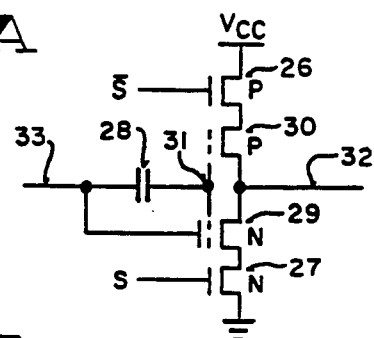
FIG_2A
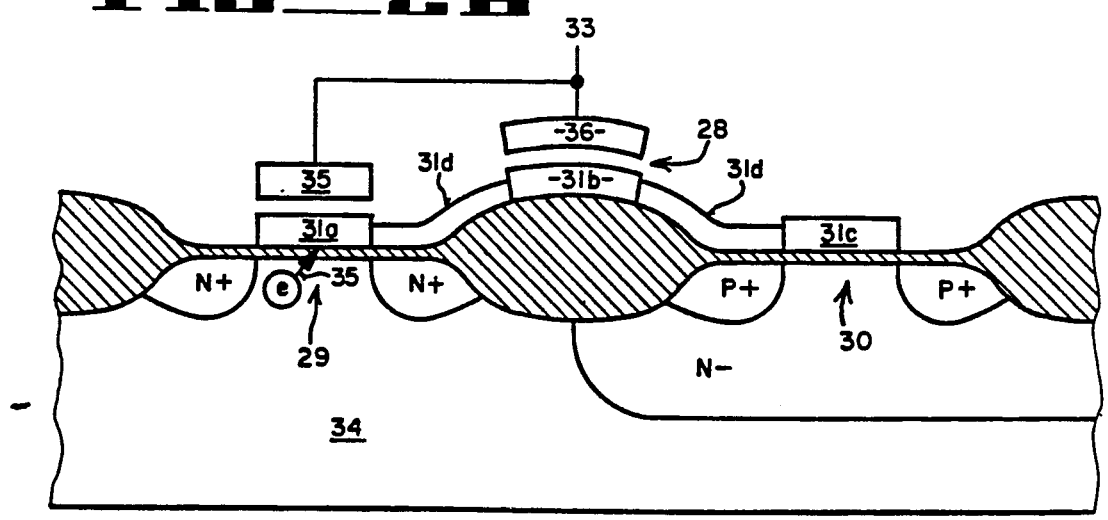
FIG_2B

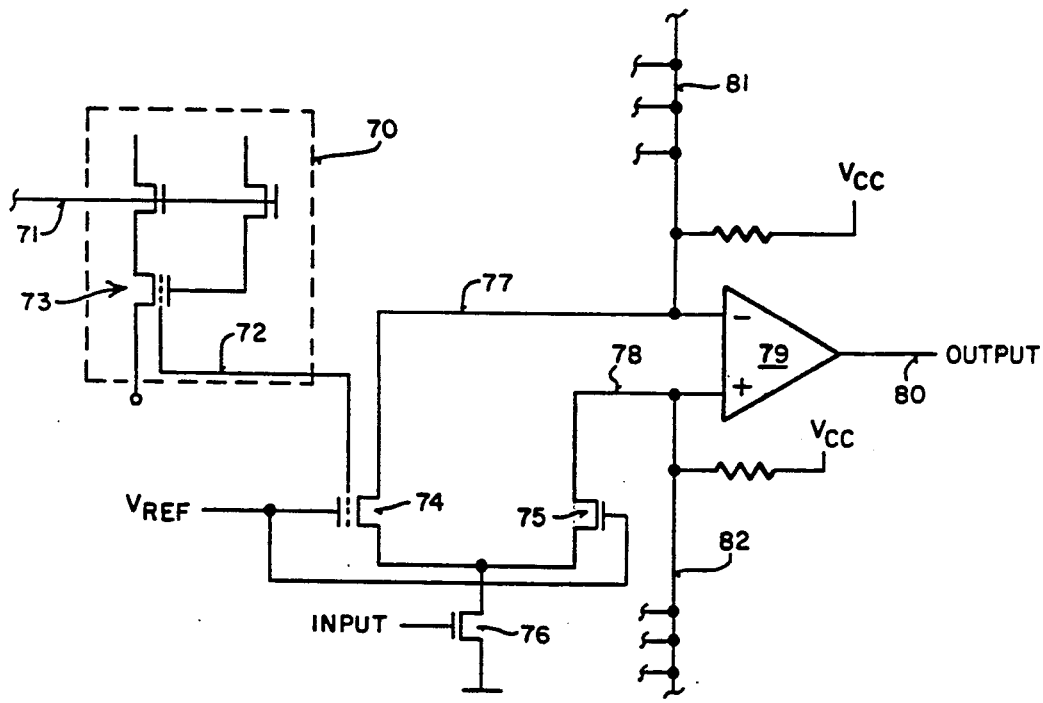
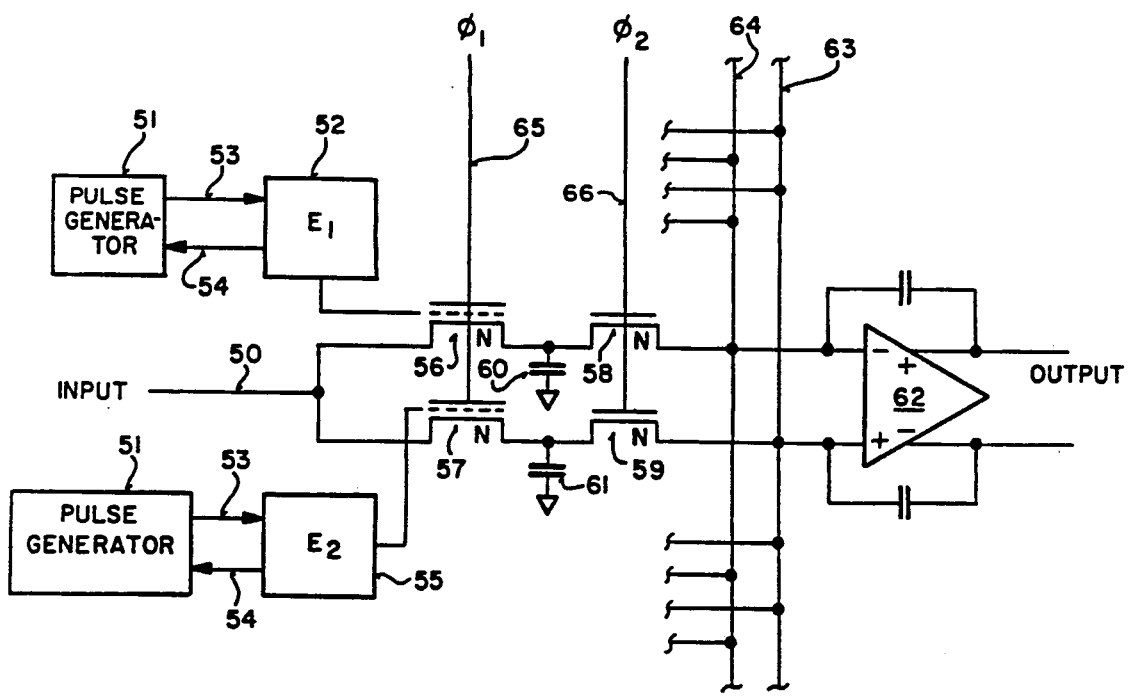

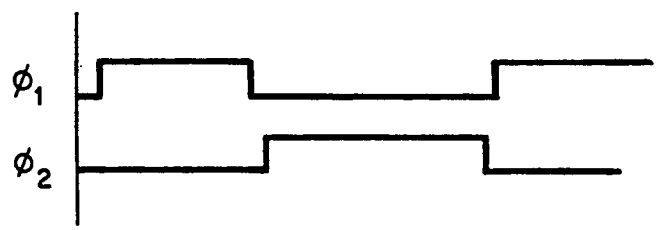
FIG_4B
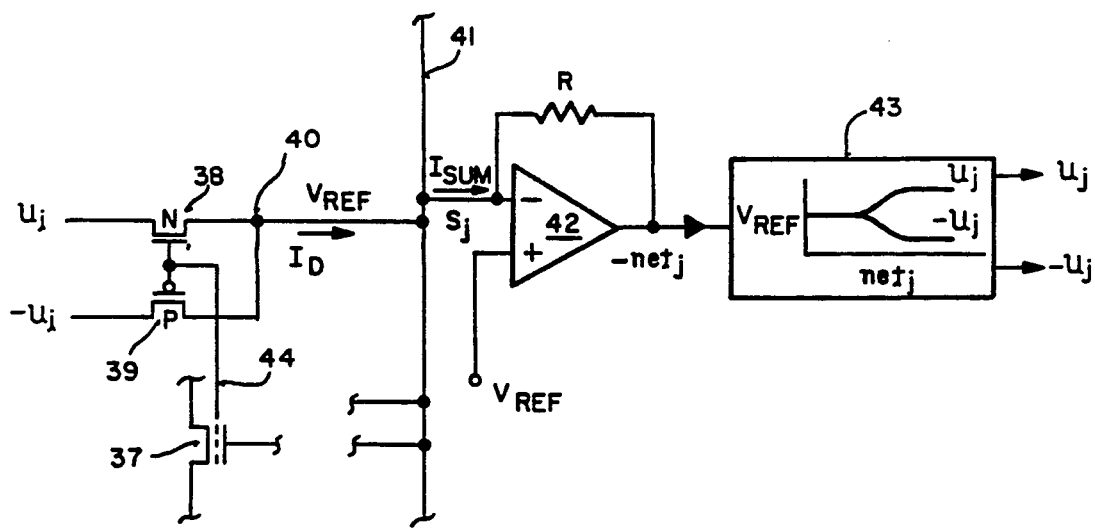
FIG_5
$$I_D = \left[V_G - V_T - \frac{Q_{FG}}{C_{FG}}\right] V_{DS}$$
$$net_j = \sum_i w_{ji} u_i$$

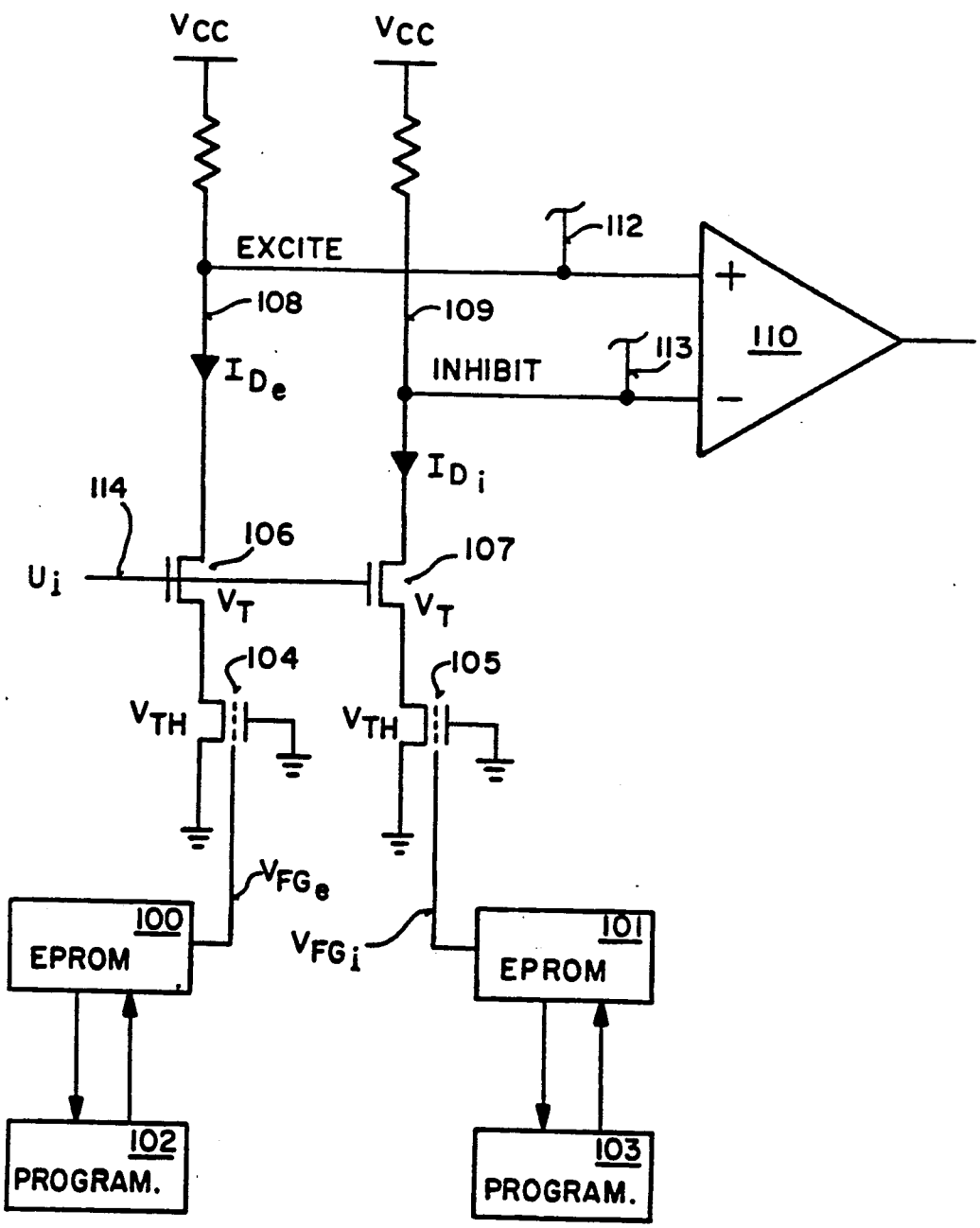
FIG_6
$$I_{D_e} = \left(\frac{Q_{FG_e}}{C_{FG_e}} - V_{TH}\right)\left(u_j - V_T\right)$$
$$I_{D_i} = \left(\frac{Q_{FG_i}}{C_{FG_i}} - V_{TH}\right)\left(u_j - V_T\right)$$

SEMICONDUCTOR CELL FOR NEURAL NETWORK AND THE LIKE

FIELD OF THE INVENTION

The invention relates to the field of semiconductor cells, particularly those having floating gate members.

PRIOR ART

Several circuit models have been proposed in an attempt to duplicate the logic performed by the human brain and the brains of other animals. These models provide for both learning (e.g., a programming mode) and decision making (e.g., recognition, associative memory). Often the modeling requires vast amounts of computation and complex computer programs. Even attempts at employing custom VLSI have resulted in relatively complex circuits. For a general discussion of neural networks, see "A Neuromorphic VLSI Learning System", by Alspector and Allen, Advanced Research in VLSI, *Proceedings of the 1987 Stanford Conference.*

FIG. 6 of the Alspector paper shows a typical neuron or cell. A neuron includes dendrites (inputs), synapses (connections), neuron body (summing amplifier) and axon (output). The synapses are simply represented by resistors in FIG. 1 of this application for purposes of discussion. It is these cells and synapses which are described in the present application.

In the prior art these cells sometimes include digital registers and digital-to-analog converters to provide a weighting factor or function. Other means are provided to multiply an input signal by this factor. Thus, each cell of the network requires a substantial amount of circuitry and even with current VLSI technology, a large number of cells (e.g., 10,000) cannot be fabricated on a single chip.

Other prior art known to Applicant is "An Associative Memory Based on an Electronic Neural Network Architecture" by R. Howard et al. *IEEE Transactions on Electronics Devices,* Vol. ED 34- July, 1987; "An Artificial Neural Network Integrated Circuit Based on MNOS/CCD Principles" by J. Sage, *Neural Network for Computing,* AIP Conference Proceedings, 1986; and, "A 20 V Four-Quadrant CMOS Analog Multiplier", by J. Babanezhad, *IEEE Journal of Solid-State Circuits,* Vol. SC-20, December 1985.

As will be seen, the present invention uses floating gate memory devices in the cells to provide the weighting factor or function and analog multiplication of an input by the weighting factor. There are numerous floating gate memory devices well-known in the prior art. For example, see U.S. Pat. Nos. 3,728,695; 3,755,721; 3,984,822; 4,142,926; 4,203,158; 4,412,310; 4,460,982; 4,519,849; and U.S. patent application Ser. No. 667,905, filed Nov. 2, 1984 and now abandoned, entitled Low Voltage $E^2$ PROM Memory. These patents and application discuss cells for electrically programmable read-only memories (EPROMs), electrically erasable and electrically programmable read-only memories (EEPROMs), flash EPROMs, and related circuitry.

There are prior art EPROM cells that have floating gates which extend to read devices. These are used to speed-up the reading of these cells.

SUMMARY OF THE INVENTION

An MOS cell is described which includes a floating gate; this cell is particularly useful in a neural network although it has other applications. The cell includes a floating gate memory device having a floating gate that is electrically charged to a level representative of the desired connection strength between two neurons. The floating gate extends to and becomes the control gate of one or more MOS devices. The conductivity of the other device or devices is thus a function of the charge on the floating gate. Multiplication is obtained by sensing the source-to-drain current which can be shown to be a function of the weighting factor (i.e., charge on the floating gate) times an input signal (e.g., voltage applied to source/drain region of the second MOS device).

BRIEF DESCRIPTION OF THE DRAWINGS

FIG. 1 illustrates a typical prior art neural network, this figure is used to show the placement on the invented cells in a neural network.

FIG. 2a is an electrical schematic of a cell employing the teachings of the present invention.

FIG. 2b is a cross-sectional elevation view of a substrate illustrating a part of the cell of FIG. 2a.

FIG. 3 is an electrical schematic of a preferred embodiment of the invented cell.

FIG. 4a is an electrical schematic of an alternate embodiment of the invented cell.

FIG. 4b shows waveforms used by the cell of FIG. 4a.

FIG. 5 is still another embodiment of the invented cell, used to illustrate the weighting function performed by the invented cell.

FIG. 6 is an electrical schematic of another preferred embodiment of the invented cell.

DETAILED DESCRIPTION OF THE INVENTION

A semiconductor cell employing floating gate memory devices and the like, particularly suited for neural networks is described. In the following description, numerous specific details are set forth such as specific conducitivity types in order to provide a thorough understanding of the present invention. It will be obvious, however, to one skilled in the art that these specific details need not be used to practice the present invention. In other instances, well-known structures and circuits have not been shown in detail in order not to unnecessarily obscure the present invention.

PRIOR ART NEURAL NETWORK

In FIG. 1 a portion of a prior art neural network is illustrated. Inputs (e.g., stimuli) to the network are applied on lines 10, 11, 12 and 13. These inputs are coupled via resistors to the input terminals of the current summing amplifiers 14, 15, 16 and 17. The output of each of these amplifiers, lines 18, 19, 20 and 21 provide output signals that are coupled via resistors to the inputs of current summing amplifiers in the next layer of the neural network. Input signals provide contributions to the output signals through resistors which are analogous to the synapses in biological neurons. For example, consider the input to amplifier 17. The signals on line 10, 12 and 13 are coupled to the amplifier 17 through resistors. More specifically, and by way of example, the potential at node 24 contributes a current to the input of amplifier 17 through the resistor 22. The resistors in the simplest case may be either "short circuits" or "open circuits", or the resistors may have values (in some cases binary weighting is used).

At first glance the network of FIG. 1 seems relatively easy to implement, but in reality it is a difficult network to realize particularly for an integrated circuit. For one thing, it is difficult to fabricate a plurality of resistors having different resistances especially if the values of the resistors are to be "programmed" into the network after the network is fabricated. (The values of each of the resistors represents the "learning" can be determined in several ways as taught by the prior art. For some applications the values of these resistors remain fixed for a decision making mode of the network as opposed to a learning mode.)

The present invention focuses on providing a cell which replaces the resistors such as the resistors 22 and 23. Note that each resistor can be considered to have an input (e.g., node 24 for resistor 22) and an output (e.g., node 25 for resistor 22). Ideally, the resistor 22 should be able to be programmed to a predetermined value after the network is fabricated and this value should be non-volatilely stored by the cell.

PRINCIPLE OF OPERATION OF THE PRESENT INVENTION

FIGS. 2a, 2b and 5 best illustrate the manner in which the present invention operates. The present invention makes use of well-known prior art memory cells which have members that are electrically charged. Most often, these cells employ polysilicon floating gates which are completely surrounded by insulation (e.g., silicon dioxide). Charge is transferred to these floating gates through a variety of mechanisms such as avalanche injection, channel injection, tunnelling, etc. The charge on the floating gate affects the conductivity in the cell and if the conductivity is above a certain level, the cell is deemed to be programmed in one binary state, and if the conductivity is below another level, it is deemed to be programmed in the other binary state. These memory cells take a variety of forms in the prior art, some being both electrically erasable and electrically programmable and others requiring for example, ultraviolet light for erasing. The cells are incorporated into memories referred to in the prior art as EPROMs, EEPROMs, flash EPROMs and the specific cells are referenced in the prior art section of this application.

The present invention employs these prior art cells, however, with the present invention, the charged member (i.e., floating gate) is extended beyond the prior art memory cell to a second device or pair devices. The charge on the floating gate is used to control the current flow in the second device.

Referring to FIG. 2a, a n-type EPROM cell 29 is shown coupled in series with a p-channel device 30. Device 30 is coupled to $V_{CC}$ through p-channel transistor 26; and, device 29 is coupled to ground through n-channel transistor 27. The device 29 as shown in FIG. 2b includes a pair of spaced-apart n+ regions disposed in a p-type substrate 34. A section 31c of a floating gate 31 is disposed above the channel defined by the spaced-apart p-type regions. A control gate 35 is insulated from and disposed above the floating gate 31. Generally, the floating gate 31 (which includes section 31a, 31b and 31c) is fabricated from polysilicon and is completely surrounded by silicon dioxide or other insulative material. As illustrated in FIG. 2b, charge is injected into the floating gate 31, by way of example, by channel injection from the channel of device 29 as illustrated by arrow 35. The charging and discharging of the floating gate may occur in a manner well-known in the prior art.

The second field device 30 shown in FIG. 2a generally comprises a field-effect transistor with the gate 31 (section 31c) extending to above the channel region of device 30. In FIG. 2b the p-channel device 30 is shown fabricated in an n-type well and includes a pair of spaced-apart p-type regions. The gate 31 extends over the channel defined by the p-type regions. It is apparent that charge on the floating gate 31 provides an electric field which will affect the current flow between the p-type regions of device 30.

A field oxide region separates devices 29 and 30. A capacitor 28 is formed on this oxide. The capacitor comprises section 31b of the floating gate 31 and member 36 separated by an oxide layer. The capacitor 28 provides additional coupling between the floating gate 31 and control gate 35. This coupling is needed for programming the floating gate.

With some MOS processes sections 31a, 31b and 31c of gate 31 can be formed from a continuous layer of polysilicon. With other processes, one (or more) of the sections are formed from different layers of polysilicon and interconnected with contacts. The contacts are illustrated by leads 31d in FIG. 2b. These contacts are typically formed spaced-apart from the active channel regions of devices 29 and 30. In either event, the gate 31 (all sections) is completely surrounded by oxide as such floating gate typically are in EPROMs.

Assume for purposes of discussion that a positive potential is applied to the drain regions of device 29 and that the source region of device 29 is coupled to ground through transistor 27. If charge (electrons) is transferred into gate 31, device 29 becomes less conductive whereas device 30 becomes more conductive. On the other hand, if the floating gate is not charged, device 29 more readily conducts while device 30 is less conductive. Note during charging line 33 is positive and capacitor 28 provides coupling to gate 31 allowing the gate to be charged. If line 33 is ramped from zero to $V_{CC}$ and the current into line 32 measured, it can be determined how much charge is present on the floating gate. During sensing S is positive (an input to the cell).

The cell of FIGS. 2a and 2b, while useful in a neural network, can also be used in other applications. For instance, in memories that have redundant elements such as rows or columns which replace defective rows or columns, and where programmable decoders are used to select the redundant rows or columns, the cell of FIGS. 2a and 2b may be used in the programmable decoders. An example of such programmable row decoders is shown in U.S. Pat. No. 4,250,572.

When the cell of FIGS. 2a and 2b is used in a neural network it is used to multiply the input signal "S" by the charge on the floating gate. The amount of charge on the floating gate and its use as a weighting factor is discussed in conjuction with FIG. 5. An input to the cell of FIGS. 2a and 2b in a neural network where the cell is replacing a resistor of FIG. 1 is "S" and "S1" and the output is present on line 32.

Another cell is shown in FIG. 5. This cell has the ability to provide multiplication where the input is other than a one or zero; that is, the analog input is multiplied by a weighting factor. The weighting factor again is determined by, or represented by, the amount of charge on the floating gate. The charging of the floating gate to the desired level is discussed in conjunction with the embodiment of FIG. 4a. That discussion applies to all embodiment.

In the cell of FIG. 5 (shown to the left of line 41), a floating gate device 37 is used which may again be a EPROM, EEPROM, flash EPROM, etc. memory cell. Its floating gate 44 extends to and becomes gate members for an n-channel device 38 and a p-channel device 39. Devices 38 and 39 are similar to ordinary field-effect transistors except that their gates are extensions of the floating gate of device 37. The charge on the floating gate controls the current flow in the channels of devices 38 and 39. One terminal of device 38 and one terminal of device 39 receives an input ($U_I$ and $-U_I$ respectively). The other terminals of devices 38 and 39 are coupled to a node 40. The line 41 provides an input to the operational amplifier 42. The line 41 and the positive terminal of the amplifier 42 are held at a reference potential. Effectively, currents are summed (from a plurality of cells) on line 41 to provide the input to amplifier 42 ($I_{SUM}$) with the contribution to this sum for the illustrated cell being shown as $I_D$. The output of the operational amplifier is a voltage equal to $V_{REF}$ minus the product of $I_{SUM}$ and R. This voltage is coupled to a signal conditioning circuit 43 which provides positive-going and negative-going signals proportional in magnitude to $I_{SUM}$ and centered about the reference potential as illustrated. Ordinary, well-known circuits may be used for circuit 43.

The cell of FIG. 5 may be coupled into the neural network of FIG. 1 by replacing the resistors of FIG. 1 with the devices 37, 38 and 39. For example. if these devices replace resistor 22, node 25 of FIG. 1 is effectively node 40 of FIG. 5 and the summing shown on line 41 of FIG. 5 represents the summing that occurs at the input to amplifier 17 of FIG. 1. For example, the output of the signal conditioning circuit 43 of FIG. 5 is a pair of lines that replace line 21 of FIG. 1. Importantly, the current $I_D$ is a function of the charge on the floating gate of the device 37 as indicated by the equation shown for $I_D$ in FIG. 5. The quantities within the bracket are the weighting function $W_{ji}$; and, $V_{DS}$ is the voltage between the drain and source. For the embodiment illustrated where one terminal devices 38 and 39 are held at a reference potential, $V_{DS}$ is the input signal. The summation on line 41 ($net_j$) is equal to the sum of products of each cell's weighting factor and input signal. The quantities within the bracket representing the weighting factor includes $V_G$, the potential on the upper gate such as the upper gates 35 and 36 shown in FIG. 2b. $V_T$ is the threshold voltage of device 38 or 39 depending on whether the cell is programmed for excitation or inhibition. $Q_{FG}/C_{FG}$ is the voltage on the floating gate due to the charged stored on the floating gate. Ideally, for $I_D$ to be the product of the weighting factor and input, $V_T$ should be close to zero volts. This, of course, can be achieved by doping the channel of the devices 38 and 39 to obtain a close to zero threshold voltage. There is a dead zone in floating gate voltage where the weighting is equal to zero for the illustrated embodiment that occurs between the threshold voltage of the p-channel device (negative potential) and the threshold voltage of the n-channel device (positve potential). This dead zone requires a large programming pulse when changing the polarity of the weighting. Also, for small weights and/or very large input voltages linearity is lost and hence, there is a limited ideal range for inputs and weights where ideal multiplication is achieved. Or put another way, there is a limited dynamic range for inputs and weights.

EMBODIMENT OF FIG. 3

The embodiment of FIG. 3 solves certain of the problems such as the limited dynamic range discussed for the cell of FIG. 5. The cell of FIG. 3 again includes a floating gate device 73 which is coupled in series with a transistor used for charging the floating gate of device 73. An additional transistor is coupled to the control gate of device 73. By application of a potential to line 71 and one terminal of device 73 (in addition to power supply potential) the floating gate 72 of device 73 may be charged to a predetermined level discussed below for the embodiment of FIG. 4. The floating gate of device 73 extends to and is part of the field-effect device 74 in the manner described for the cell of FIG. 2.

Devices 74 and 75 each have one of their terminals coupled to the differential inputs of the amplifier 79. Specifically, line 77 is coupled to the negative terminal of the amplifier and line 78 to the positive terminal. The other terminals of field-effect devices 74 and 75 are coupled to the field-effect device 76. This device receives an input signal on its gate.

The operational amplifier 79 receives inputs from other cells. For example, the equivalent of line 77 of other cells are coupled to line 81 and the equivalent of line 78 of other cells are coupled to line 82. The output of amplifier 79 (line 80) as described above provides an input to other cells. The devices 74, 75 and 76 are all of the same conductivity type for the embodiment illustrated. The amplifier 79 amplifies the current difference on lines 78 and 79. If for a moment the effect on device 74 of the charge in floating gate 72 is ignored, and devices 74 and 75 are assumed to be identical, then for any input to the device 76, the differential current is zero. This represents a weighting factor of zero. As charge is placed on the gate 72, the differential current between devices 74 and 75 increases (assuming line 81 and 82 are held at a constant potential) and the amount of this difference is multiplied by the input signal applied to device 76.

Therefore, the output of amplifier 80 represents the input signal applied to the cell at the gate of device 76 multiplied by the weighting factor (charge on a floating gate 72).

EMBODIMENT OF FIG. 4

Generally in the prior art, floating gate memory devices are charged (and erased) with a series of pulses. After pulses are applied, the conductivity of the device is examined to determine if the floating gate is charged (or erased). If it is not, additional charging occurs by applying more pulses to the device. With the present invention, charge on the floating gate is monitored to determine when the charge level is at the desired level, that is, at the level needed for a particular weighting factor.

FIG. 4a shows pulse generators 51 coupled to floating gate devices 52 and 55. The pulses used for charging these devices are coupled to the devices on lines 53. The amount of charge is determined indirectly by monitoring the threshold voltage of the floating gate device or the threshold voltage of the second device which shares the floating gate. This monitoring is shown by lines 54. Ordinary, well-known circuits may be used for generating the pulses and for monitoring the voltages to determine the level of charge on the floating gate.

In effect, the amount of charge on the floating gate, as will be seen, determines the value of the resistors or synapses in the neural networks such as resistors 22 and 23 of FIG. 1.

The cell of FIG. 4 operates in a dynamic mode and therefore consumes less power. It is particularly useful where the input is either a one or a zero. Two floating gate devices are used in this embodiment illustrated as E1 (52) and E2 (55). Again, these devices may be cells for EPROM, EEPROM, flash EPROM, etc. As previously discussed, a pulse generator is shown coupled to device 52 for charging this device. Such a generator would also be associated with E2 as well as the other floating gate devices previously described. The input line 50 is coupled to the input terminals of the amplifier by two separate paths. One path includes devices 56 and 58, the other devices 57 and 59. The floating gate of device 52 extends into device 56; similarly, the floating gate of device 55 extends into device 57 such as shown in FIG. 2. A capacitor 60 is present between devices 56 and 58 and similarly, capacitor 61 is present between devices 57 and 59.

For the n-channel embodiment illustrated, positive waveforms are applied to lines 65 and 66. As shown in FIG. 4b, line 65 is first brought high (while line 66 is low), permitting capacitors 60 and 61 to be charged. Then, after the potential on line 65 has been brought low, line 66 is brought high, permitting the charge from these capacitors to be coupled through devices 58 and 59 to the operational amplifier 60. Charge from other cells is also coupled to amplifier 62 by lines 63 and 64.

For the embodiment of FIG. 4a, the weighting factor is determined by the difference in charge stored on the floating gate devices 52 and 55. For instance, if both floating gates have the same charge, both devices 56 and 57 will pass the same input current for a given signal on line 50. Capacitors 60 and 61 will charge to the same level and the same amount of charge will be coupled to amplifier 62. This differential amplifier for this case will provide a zero difference at its output lines. The greater the difference in charge on the floating gates of devices 52 and 55, the greater the weighting factor becomes. The output of the amplifier 62 may be converted to a binary signal where needed using ordinary circuits to provide an input to other cells in a neural network.

EMBODIMENT OF FIG. 6

The embodiment of FIG. 6 has the advantage of having devices of a single conductivity type, for example, all n-channel devices. The cell includes a pair of floating gate memory devices shown as EPROMs 100 and 101. These may be ordinary devices as discussed for the other embodiments with floating gates that extend into devices 104 and 105. Pulse genrators 102 and 103 are used to program the gates of devices 100 and 101, respectively to the desired charge level to obtain a weighting factor as in other embodiments.

The floating gates from devices 100 and 101 extend over the channel region of devices 104 and 105, respectively. The charge on these gates thus control the current $I_{De}$ (line 108) and $I_{Di}$ (line 109). The control gates of devices 104 and 105 are coupled to ground; accordingly, $V_{FGe}$ and $V_{FGi}$ are zero before any charge is added to or removed from the floating gate of devices 104 and 105. Devices 104 and 105 are coupled in series with transistors 106 and 107, respectively. An input to the cell is applied on line 114 and is shown as $U_i$. Preferably the threshold voltage of devices 104, 105, 106 and 107 are close to zero volts, then $V_{TH}$ and $V_T$ are approximately zero. For this cascaded embodiment devices 106 and 107 are relatively wide devices and have low body effect.

$I_{De}$ (exciting current) and $I_{Di}$ (inhibiting current) are coupled to the differential amplifier 110. The floating gates of devices 100 and 101 are charged to different levels to obtain larger weighting functions. Note a large positive charge on the floating gate of device 101 causes more current $I_{Di}$ which increases the output of amplifier 110. A large positive charge on the floating gate 100 tends to decrease the output of amplifier 110. The equations for $I_{De}$ and $I_{Di}$ are shown in FIG. 6. Again the weighting factor is proportional to the charge on the floating gate and is multiplied by an input voltage from another amplifier.

Summing from other cells occurs at the input to amplifier 110. Lines 112 and 113 illustrate inputs from other cells.

Thus, several cells have been described which are particularly suitable for a neural network. The weighting factor is represented by electrical charge stored on a floating gate. The charge typically remains stored on these floating gates for long periods of time, hence, providing non-volatile storage for the weighting factors. The floating gates may be charged, each to a different level, after the circuit is fabricated. The cells readily lend themselves to high density VLSI circuits.

We claim:

1. A semiconductor cell formed on a substrate comprising:

a first device having a pair of first spaced-apart regions disposed in said substrate, said first spaced-apart regions being of a first conductivity type said first spaced-apart regions defining a first channel between them, a floating gate disposed above said first channel and insulated from said first channel, and a first control gate disposed above and insulated from said floating gate, electric charge being transferable to said floating gate;

a second device having a pair of second spaced-apart regions disposed in said substrate, said second spaced-apart regions being of a second conductivity type, said second spaced-part regions defining a second channel between them, said floating gate extending over and being insulated from said second channel;

means for charging said floating gate to a predetermined level of charge said predetermined level of charge on said floating gate affecting the conductivity of said second device so as to provide a weighting factor of a desired strength in a network, such that an input to said cell in said network is multiplied by said weighting factor.

2. The cell defined by claim 1 including a second control gate disposed above and insulated from said second channel.

3. The cell defined by claim 2 wherein said first and second control gates are coupled to one another.

4. The cell defined by claim 3 wherein said floating gate comprises a polysilicon member.

5. A semiconductor cell formed on a substrate comprising:

a first device formed on said substrate having an electrically chargeable member, said first device including means for electrically charging said chargeable member to a predetermined level of charge;

a second device having a pair of spaced-apart regions disposed in said substrate, said spaced-apart regions defining a channel therebetween, said chargeable member extending over said channel so as to provide an electric field affecting the current flow in said channel between said spaced-apart regions, said predetermined level of charge on said chargeable member affecting the conductivity of said channel so as to provide a weighting factor;

first circuit means for applying an input signal to one of said spaced-apart regions;

second circuit means for receiving an output signal from the other of said spaced-apart regions;

said cell providing multiplication of said input signal by said weighting factor represented by the charge on said chargeable member.

6. The cell defined by claim 5 wherein said second device comprises a pair of field-effect devices, one being an n-type device and the other a p-type device, said chargeable member extending over both of said pair of field-effect devices.

7. The cell defined by claim 5 wherein said first circuit means comprises a field-effect device, said first circuit means comprising a gate, source region and drain region, the gate of said first circuit means coupled to receive said input signal, and one of said regions of said first circuit means coupled to one of said spaced-apart regions of said second device.

8. The cell defined by claim 7 including a third device comprising a field-effect device, said third device comprising a gate, source region and drain region, one of said regions of said third device coupled to of said spaced-apart regions of said second device, the other of said regions of said third device and the other of said regions of said spaced-apart regions of said second device providing differential output signals from said cell.

9. The cell defined by claims 5, 6, 7 or 8 wherein said chargeable member comprises a floating gate.

10. The cell defined by claim 8 wherein said second circuit means comprises a differential amplifier.

11. A semiconductor cell formed on a substrate comprising:

an electrically programmable floating gate device formed on said substrate having a floating gate, said electrically programmable device including means for charging said floating gate to a predetermined level of charge;

a first transistor comprising a field-effect transistor, said first transistor having first and second spaced-apart regions and a gate, said floating gate extending between said gate of said first field-effect transistor and said spaced-apart regions of said first transistor such that charge on said floating gate affects the current flow between said first and second spaced-apart regions of said first transistor;

a second transistor comprising a field-effect transistor, said second transistor having first and second spaced-apart regions and a gate, said gate of said second transistor being coupled to receive an input signal, one of said regions of said second transistor being coupled to said first region of said first transistor;

a third transistor comprising a field-effect transistor, said third transistor having first and second spaced-apart regions and a gate, said the first region of said third transistor being coupled to said first region of said first transistor, the gate of said third transistor being coupled to the gate of said first transistor;

said second regions of said first and second transistors providing a differential output from said cell.

12. A semiconductor cell comprising:

a floating gate device having a floating gate which is electrically chargeable, said floating gate device including means for charging said floating gate to a predetermined level of charge;

first and second transistors of a first conductivity type coupled in series, said first transistor comprising a first pair of spaced-apart regions, and a first control gate, said second transistor comprising a second pair of spaced-apart regions and a second control gate;

a capacitor having a pair of terminals, one of said terminals being coupled to one of said first regions and one of said second regions;

said floating gate extending between said first control gate and said first regions;

clock generation means for generating clocking pulses, coupled to said first and second control gates.

13. In a neural network having a plurality of nodes each of which has an input and an output, the output of each of said nodes being a weighted function of the input to said node, an improvement comprising:

a floating gate device having a floating gate which is electrically chargeable said floating gate device including means for charging said floating gate to a predetermined level of charge;

a field-effect device having a pair of spaced-apart regions disposed in a substrate, said spaced-apart regions defining a channel therebetween, said floating gate extending over said channel so as to provide an electric field effecting the flow of current in said field-effect device means for applying an input signal to one of said spaced-apart regions, and;

means for obtaining an output signal from the other of said spaced-apart regions.

14. In a neural network a cell found on a substrate comprising:

an electrically programmable memory device having a floating gate insulated from said substrate;

a first device comprising a field-effect device, said first device comprising a control gate and a pair of spaced-apart regions disposed in said substrate, said spaced-apart regions defining a channel therebetween, said floating gate extending over said channel of said first device;

a second device comprising a field-effect device, said second device having a gate coupled to receive an input signal;

said memory device and said first and second devices being coupled in series;

means for charging said floating gate to a predetermined level of charge, said predetermined level of charge on said floating gate affecting the conductivity of said first device so as to provide a weighting factor of a desired strength in said network.

15. A semiconductor synapse for providing connections in a neural network comprising:

a floating gate memory device;

charging means for charging said floating gate to a predetermined level of charge, said charging means coupled to said memory device when charging said floating gate;

input means for receiving an input signal for said synapse;

said synapse multiplying said input signal by a weighting factor represented by said charge on said floating gate, by current control under said floating gate.

16. A neural network comprising:
a plurality of operational amplifiers each having input summing nodes;
a plurality of input lines;
a plurality of connection means for connecting at least some of said input lines to some of said summing nodes, each of said connection means comprising:
at least one floating gate memory device having a foating gate for storing charge, and means for providing an output current to one of said summing nodes, said charge on said floating gate affecting the conductivity of said connection means, such that said output current is representative of the product of a signal on one of said input lines and the charge on said floating gate.

* * * * *